United States Patent [19]
Kojima et al.

[11] Patent Number: 5,687,382
[45] Date of Patent: Nov. 11, 1997

[54] HIGH SPEED, REDUCED POWER MEMORY SYSTEM IMPLEMENTED ACCORDING TO ACCESS FREQUENCY

[75] Inventors: Hirotsugu Kojima, Foster City; Katsuro Sasaki, Los Altos, both of Calif.

[73] Assignee: Hitachi America, Ltd., Tarrytown, N.Y.

[21] Appl. No.: 473,761

[22] Filed: Jun. 7, 1995

[51] Int. Cl.$^6$ .............................. G06F 1/32; G11C 11/40
[52] U.S. Cl. ..................... 395/750; 365/227; 364/707
[58] Field of Search ....................... 395/750; 365/226, 365/227, 228, 229; 364/707

[56] References Cited

U.S. PATENT DOCUMENTS

| | | | |
|---|---|---|---|
| 4,096,584 | 6/1978 | Owen, III et al. | 365/227 |
| 4,665,507 | 5/1987 | Gondon et al. | 365/190 |
| 4,820,974 | 4/1989 | Katsura et al. | 324/73 |
| 5,222,231 | 6/1993 | Gunji | 395/188.07 |
| 5,367,687 | 11/1994 | Yoshida | 365/189.09 |
| 5,457,790 | 10/1995 | Iwamura et al. | 395/495 |

Primary Examiner—Jack B. Harvey
Assistant Examiner—Sumati Lefkowitz
Attorney, Agent, or Firm—Flehr Hohbach Test Albritton & Herbert LLP

[57] ABSTRACT

A memory system including a first memory area (MEM-A) implemented using memory units including low threshold voltage transistors powered by a low supply voltage source, and a second memory area (MEM-B) implemented using memory units including higher threshold voltage cells powered by a higher supply voltage source. The first memory area, MEM-A, is designated to contain frequently accessed variables, with less frequently accessed variables designated for storage in the second memory area, MEM-B. The most frequently accessed variables stored in MEM-A provide for fast access at a low power per access power dissipation level due to the lower supply voltage and lower threshold voltage design. Alternatively, the less frequently accessed variables stored in MEM-B require a high power per access, but negligible leakage current during static steady state conditions.

9 Claims, 6 Drawing Sheets

HIGH SPEED, REDUCED POWER MEMORY SYSTEM IMPLEMENTED ACCORDING TO ACCESS FREQUENCY

The present invention relates generally to memory devices. More particularly, to a reduced power memory system optimized to reduce static leakage current while maintaining speed performance for frequently accessed variables.

BACKGROUND OF THE INVENTION

The present invention provides an improvement in memory systems by combining low threshold voltage and low supply voltage memory cells with higher threshold voltage and higher supply voltage memory cells for realizing a reduced power memory system.

Memory system performance can be measured in terms of speed, cost, power dissipation, overall size (area) and other various performance parameters. In the ever increasingly competitive signal processor world, designers have strived to improve the power dissipation performance of memory systems utilized in conjunction with these processors so as to minimize package size. However, designers still were required to continue to deliver competitive speed performance. Accordingly, designers of memory systems have used various methods to improve the power dissipation performance of memory systems while balancing speed concerns. In the prior art these attempts can be classified into two areas: cell level improvements, and system level improvements.

Memory cell designers balance numerous considerations in the development of a cell design. Typically, designers will optimize cells for a number of considerations including power consumption and speed concerns. In order to optimize a device for speed, designers typically will implement designs which include low threshold voltage transistors. By lowering the threshold voltages of the individual transistors in the memory cells, speed performance may be improved. However, by lowering the threshold voltages, an accompanying increase in the leakage current of the transistor arises, thereby affecting the resultant power consumption of the memory cell.

Alternatively, memory cell designers may optimize a cell design for reduced power consumption. In order to improve the overall power dissipation of a given cell, a designer may either improve the performance of the cell while the cell is in its dynamic state (during a cell access) or during its static state (non-access or standby state). Designers in the prior art have implemented memory systems which were optimized for only one of these two states (dynamic or static). Typically designers have opted toward memory cells having high threshold voltage transistors which are powered by high voltage power supplies in order to maintain high speed performance. However, by utilizing the higher supply voltages, the power consumed per access of the memory cell transistors is proportionately higher due to the increased voltage levels. Alternatively, designers have implemented memory systems utilizing low threshold voltage transistors which were in turn powered by low supply voltages. Those ordinarily skilled in the art will recognize that while these lower supply voltages improve the power consumption performance during the dynamic state (access of the cell), an accompanying increase in the steady state leakage current arises due to the use of the lower threshold devices. While each of these particular configurations allows for a reduced power consumption for a given state of the transistors used in the memory cells, none of the individual configurations provide optimization at both the static and the dynamic state while maintaining speed considerations.

For example, most digital signal processors and microprocessor employ static RAM. The leakage current associated with the static RAM contributes in a large part to the standby power dissipated by the microprocessor or digital signal processor device. Typically, static RAM induces a large leakage current when it is implemented with low threshold voltage transistors powered by low supply voltage configurations (0.5 μm or finer CMOS process devices). Alternatively, if high threshold voltage transistors are implemented, the leakage current for the device will be minimized but at the expense of degrading the speed performance associated with the low supply voltage. Finally, if high threshold voltage transistors are implemented with a high supply voltage configuration, the speed performance will improve, however, increased power dissipation will necessarily result at each access. Accordingly, designers are forced to choose between power consumption and speed concerns in designing typical static RAM memory cell devices.

At the system level, designers confronted with the same power dissipation and speed considerations have implemented various architectures in order to improve speed performance and minimize power dissipation. One such example is the use of a cache memory. The basic idea of cache memory is to localize memory variables which are most frequently accessed by employing cache memory. Accordingly, the cache memory architecture is designed to minimize the number of accesses to main memory dramatically, thereby improving the overall speed performance and power consumption for the memory system. However, in the typical prior art cache memory architecture, the supply voltage of the main memory and the cache memory is the same in order to keep access speed to the cache memory high. Accordingly, the power dissipation of both the cache memory and the main memory may not be optimized for both steady state and dynamic operations as described above.

Similarly, other speed directed design schemes have been implemented including paged memory systems. In a paged memory system, multiple accesses to individual pages of the memory device may be realized during the same clock cycle, thereby improving speed performance of the memory system. However, the power dissipation per access at the page level, or the power dissipation in the standby mode is the same for any individual memory cell in the paged architecture. The problem facing designers is how to reduce power consumption in a memory system during both the static and dynamic modes without suffering a speed degradation.

SUMMARY OF THE INVENTION

It is an object of the present invention to provide a reduced power memory architecture optimized for speed performance while minimizing overall power consumption.

It is another object of the present invention to provide a reduced power memory architecture which implements both low threshold voltage and low supply voltage memory cells in conjunction with high threshold and high supply voltage memory cells implemented in a single or multi-chip environment for minimizing power consumption in the memory system.

It is another object of the present invention to provide a method of programming a reduced power memory system to minimize the power dissipated per access for frequently accessed memory cells while also minimizing the power dissipation of less frequently accessed memory cells in the standby mode.

The apparatus of the present invention comprises a memory system including a first memory area (MEM-A) implemented using memory cells including low threshold voltage transistors powered by a low supply voltage source, and a second memory area (MEM-B) implemented using memory cells including higher threshold voltage cells powered by a higher supply voltage source. The first memory area, MEM-A, is designated to contain frequently accessed variables, with less frequently accessed variables designated for storage in the second memory area, MEM-B. The most frequently accessed variables stored in MEM-A provide fast access at a low power per access power dissipation level due to the lower supply voltage and lower threshold voltage design. Alternatively, the less frequently accessed variables stored in MEM-B require a high power per access, but negligible leakage current during static steady state conditions.

BRIEF DESCRIPTION OF THE DRAWINGS

Additional objects and features of the invention will be more readily apparent from the following detailed description and appended claims when taken in conjunction with the drawings, in which:

DESCRIPTION OF PREFERRED EMBODIMENTS

Figure 1:
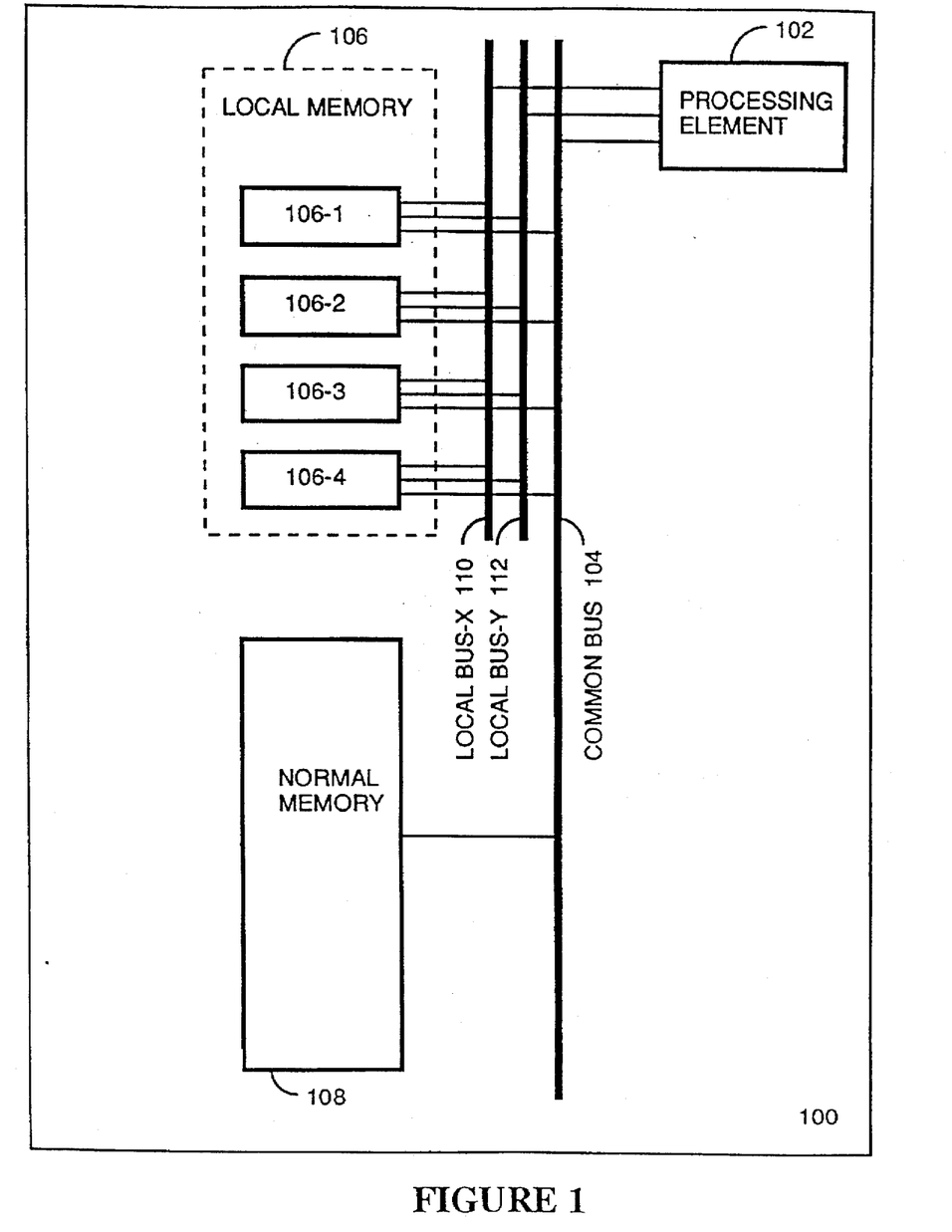
FIG. 1 is a block diagram of a memory system according to the preferred embodiment of the present invention.

Referring to FIG. 1, a memory system 100 according to the preferred embodiment of the present invention is shown. A processing element 102 is connected via a common address and data bus 104 to a local memory device 106 and a normal memory device 108. The processing element 102 is additionally connected to a local X-address and X-data bus 110 as well as to a local Y-address and Y-data bus 112. The local memory 106 is comprised of a plurality of individual pages 106-1, 106-2, 106-3, and 106-4 representing a page structured memory unit. Each page 106-1 through 106-4 is coupled to both the X and Y data and address busses 110 and 112 respectively. In the preferred embodiment, a page structured local memory unit is implemented such that in conjunction with separate local address and data buses X and Y, 110 and 112, up to two local memory accesses may be made during the same clock cycle.

Local memory 106 is comprised of a plurality of memory units constructed with low threshold voltage transistors which are powered by a low voltage power supply. In the preferred embodiment, the power supply voltage ($v_{DD}$) is 1.5 volts with a low threshold voltage ($v_{th}$) at approximately 0.2 volts. The normal memory 108 includes a plurality of memory units employing higher threshold voltage transistors having a threshold $v_{th}$ approximately equal to 0.5 volts, with each transistor powered by a higher supply voltage set approximately equal to 3 volts.

The power consumption savings associated with this combinational memory architecture may not be readily apparent. However, when utilized in conjunction with a "cache" type architecture, a significant power consumption saving is realized.

The unique architecture presented in the memory system 100 allows programmers a choice as to which memory location various program data or variables will be stored. Accordingly, programmers may direct the storage of highly accessed data/variables to the local memory location 106 while storing relatively low accessed data at the normal memory location 108.

As was discussed previously, the power dissipation of a memory element may be characterized by the amount of power dissipated during a standby mode in which the memory element is not being accessed as well as the amount of power dissipated during a typical access process. Accordingly, in order to characterize the power dissipation attributable to a memory location which is accessed frequently, an analysis of the memory unit performance during accesses is required. Conversely for a memory location which is accessed infrequently, the typical contribution to power dissipation may be characterized by the amount of power dissipated in the standby or wait mode.

Accordingly, implementing a memory structure according to the preferred embodiment of the present invention, the power dissipation of the memory system 100 is optimized by providing for a reduced power first memory bank (local memory 106) which is sufficiently sized to hold the most frequently accessed data/variables in a given application program coupled with a second memory bank for the storage of all lesser accessed variables/data. The first memory area (local memory 106) is characterized as having a reduced per access power consumption due to the selection of low threshold voltage transistors which are powered by a low voltage power supply. The second memory area is characterized by reduced power dissipation during the standby mode attributable to the higher threshold transistors which are powered by a high voltage power supply. Accordingly, for a given program, the power consumption of the memory system may be optimized by the effective loading of program data into the memory system according to relative access requirements.

In the preferred embodiment, the local memory 106 has been partitioned embodying a page structured memory device. Those ordinarily skilled in the art will recognize that a non-partitioned local memory may be implemented without departing from the spirit of the present invention. The partitioning of the local memory is a design choice, related to multiple simultaneous accesses of the same memory element and should not be construed as limiting.

Figure 2:
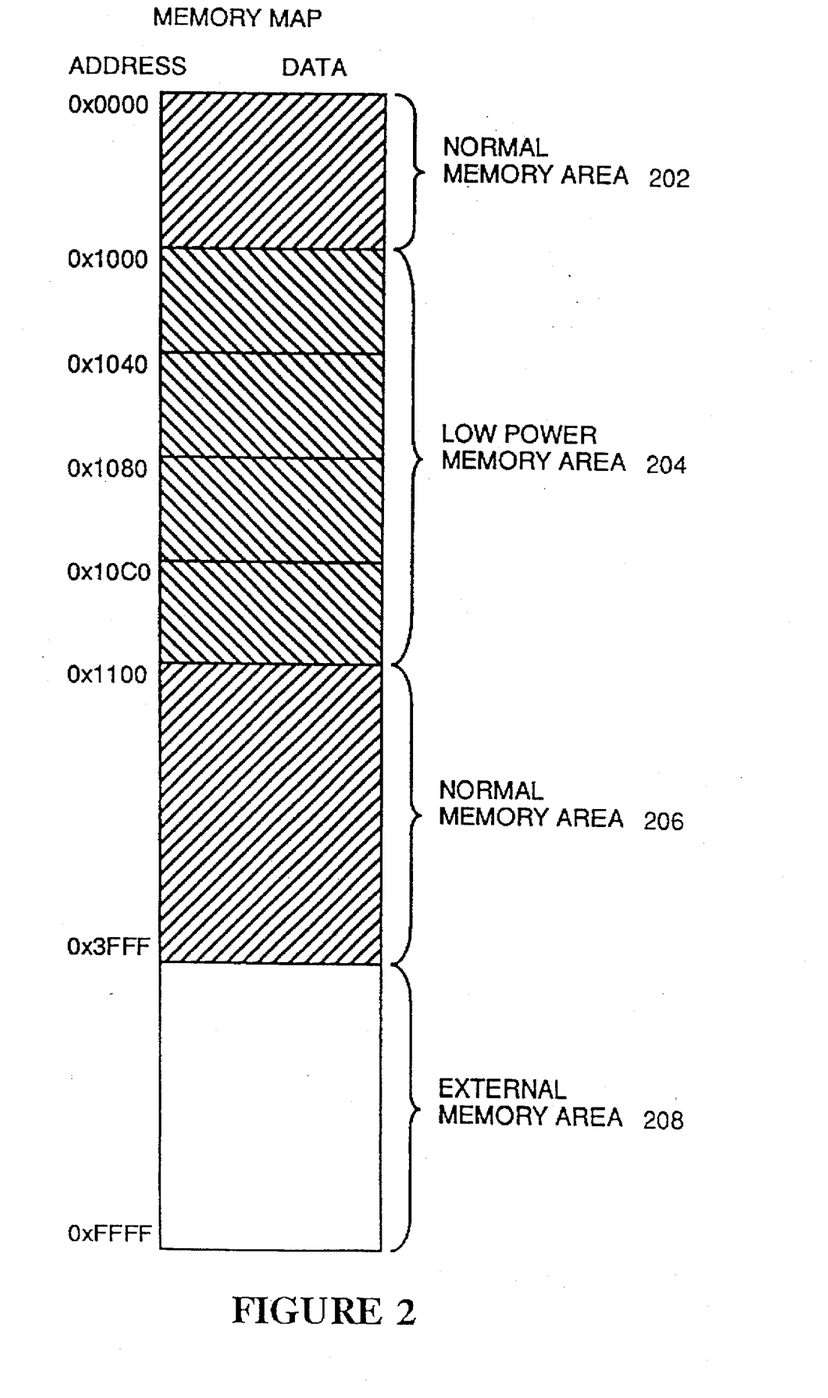
FIG. 2 is a sample memory map for use with the memory system according to the preferred embodiment of the present invention.

Referring to FIG. 2, a memory map associated with the preferred embodiment of the present invention is shown. The memory map includes a first normal memory area 202 starting at relative address 0x0000, a page structured low power memory area 204 having a first page starting at address 0x1000, a second memory page starting at address 0x1040, a third memory page starting at relative address 0x1080, and a fourth memory page starting at relative address 0x1000. Finally the memory map includes a normal memory area 206 starting at relative address location 0x1100. In addition, the memory map includes an external memory area 208 reserved for addresses associated with external memory. In this embodiment, a small portion of the memory (256 words) is configured as local memory (low power memory area 204). The local memory is implemented with low threshold voltage transistors and low supply voltage devices for minimizing power dissipation during memory unit accesses. The remainder of the memory is implemented using high threshold voltage transistors and high supply voltage devices over the 15.75 k remainder of the memory structure. Accordingly, this type of memory architecture allows for a lower power dissipation per access for the most frequently accessed data stored in the memory architecture while also allowing for the lowest power dissipation in standby or non-operation mode for less frequently accessed data. In this way, the overall power dissipation for the particular memory system is optimized without adversely affecting speed performance for the overall memory device.

Figure 3:
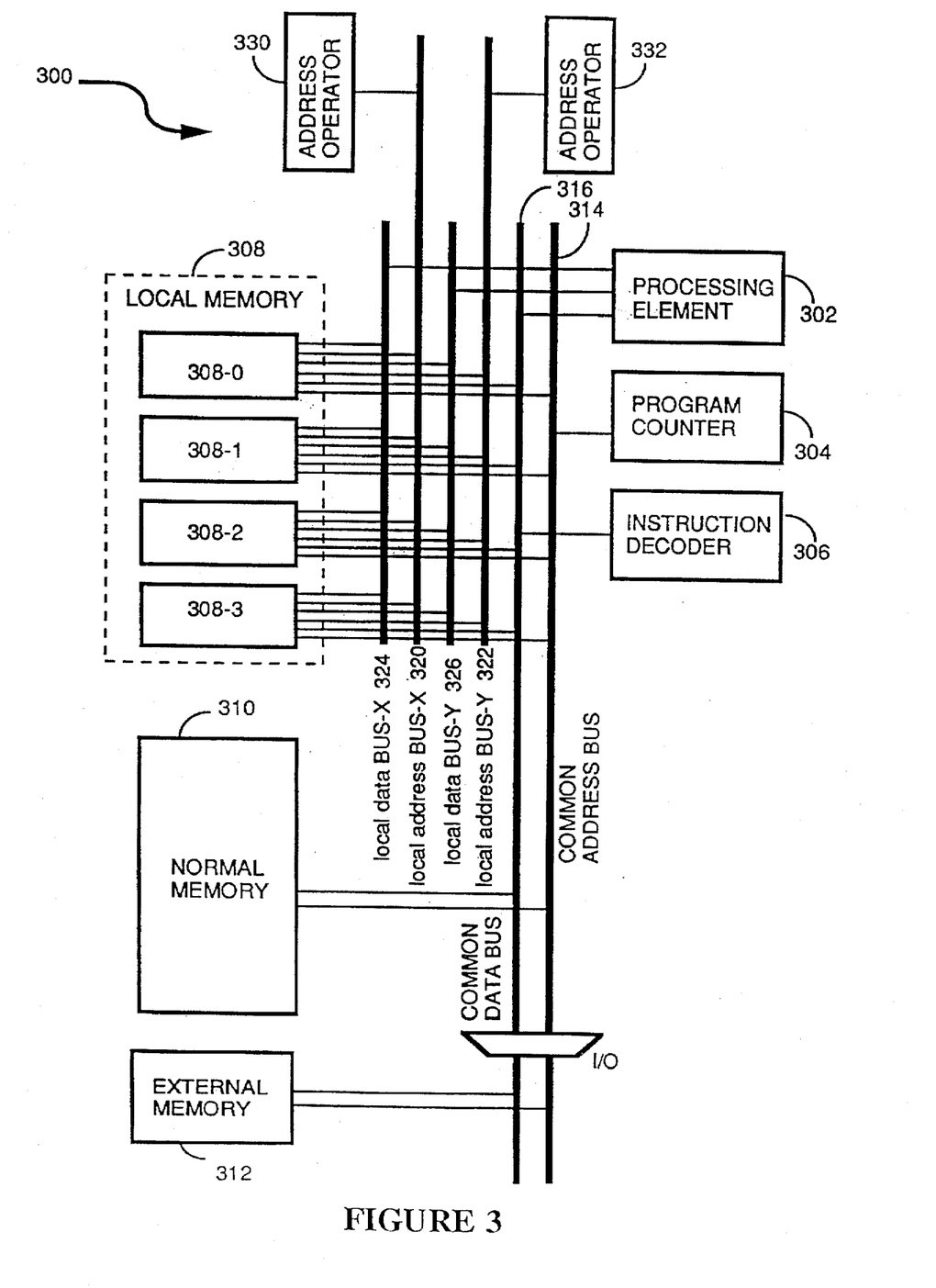
FIG. 3 is a block diagram of a digital signal processor implementing a memory system according to the preferred embodiment of the present invention.

Referring to FIG. 3, a digital signal processor 300 incorporating the memory architecture of the present invention is shown. The digital signal processor 300 includes a processing unit 302, program counter 304, instruction decoder 306, local memory 308, normal memory 310, and external memory 312. The DSP 300 further includes a common address bus 314, common data bus 316, X and Y local address buses 320 and 322, and X and Y local data buses 324 and 326, respectively. An address operator 330 is connected to the X local address bus 320 in order to access various pages of the local memory 308. A second address operator 332 is coupled to the Y address bus 322 in order to access up to two different pages of local memory in the same memory cycle.

The address operators 330 and 332 have address registers to keep a variety of address values such as the current address and incremental displacement or other address pointers.

In the preferred embodiment, local memory 308 is comprised of low voltage threshold transistors, typically on the order of 0.2 volt ($v_{th}$=0.2 volts). Additionally, a multi-page local memory is utilized including memory page 0 through memory page 3: 308-0, 308-1, 308-2 and 308-3, respectively. The multi-page memory architecture is implemented in order to reduce power dissipation by minimizing the capacitance on the local address and data buses. In the preferred embodiment, the local address and data buses have a smaller load capacitance because of the number of modules connected to the bus is small relative to the common bus, thus allowing for a physical wiring length which is shorter than the common bus configuration. As such, a reduced power dissipation due to capacitances is realized. As was described above, the dual address operator configuration allows for the access of up to two pages of the page structured local memory 308 during the same clock cycle because of the independent local address buses 320 and 322.

Figure 4:
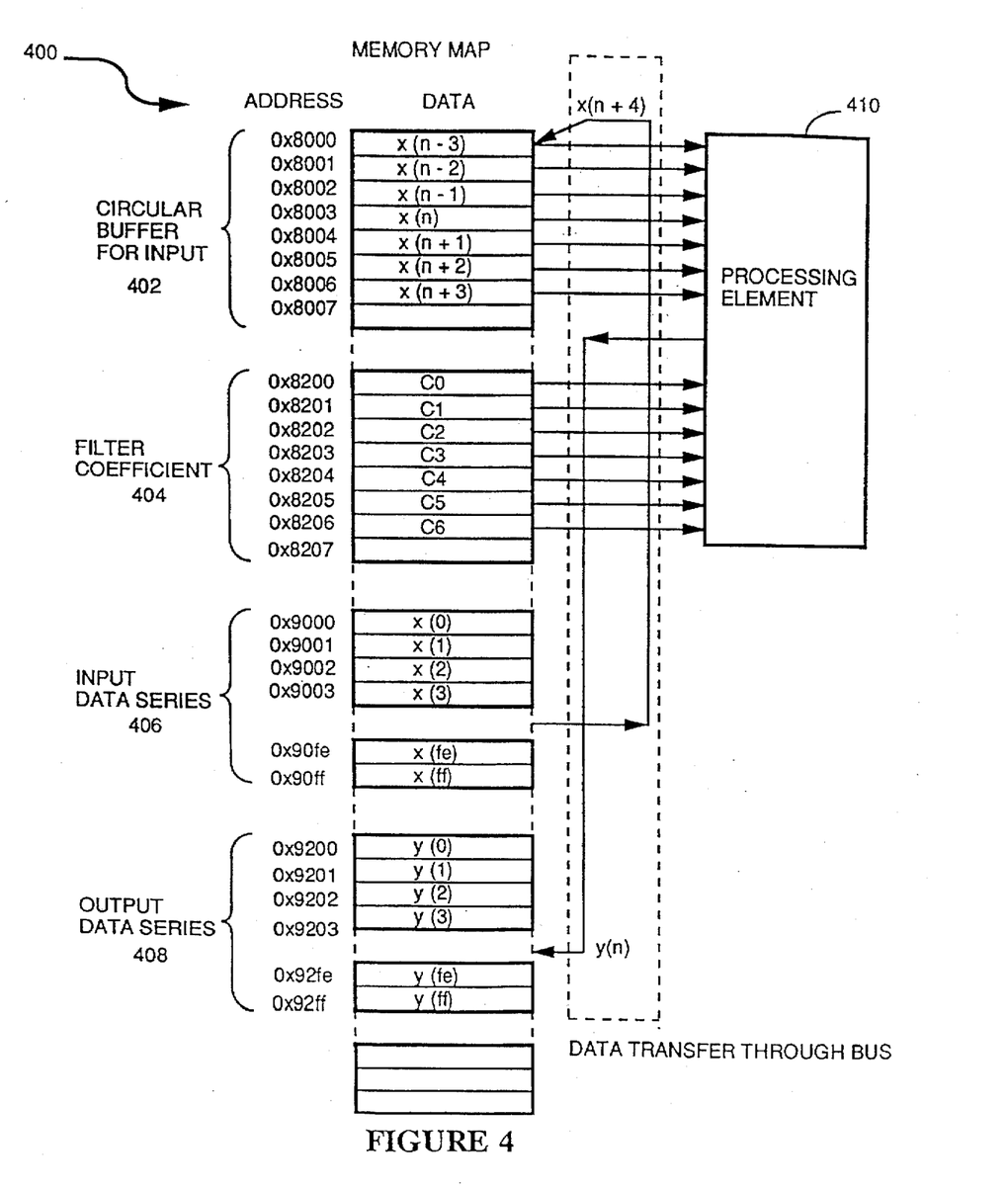
FIG. 4 shows a memory map loaded with a seven tap filter program for use in conjunction with the improved memory system of the preferred embodiment of the present invention.

Referring to FIG. 4, an example of a data transfer operation between a memory system implementing the memory architecture of the preferred embodiment of the present invention and a processing element is shown. In this example, a seven tap filter program execution cycle is shown in order to high-lite the advantages of the memory architecture of the preferred embodiment of the present invention.

A memory map 400 has been loaded with a seven tap filter program. For the purposes of this example, memory location 0x8000 to 0x8006 has been assigned as a circular buffer for input data (402). Memory address location 0x8200 to 0x8206 has been assigned to store filter coefficients associated with the seven tap filter program (404). 256 input data series have been stored in the memory from address location 0x9000 to 0x90ff (406), and finally the output data series resulting from the calculation of the filter is designated to be stored in the memory from address 0x9200 to 0x92ff (408).

In operation, the processing element 410 calculates an nth output y(n), by using the seven coefficients stored at memory locations 0x8200 through 0x8206 in conjunction with seven input data series stored in the circular buffer starting at location 0x8000 through 0x8006. In this example, the circular buffer is a temporal memory and is commonly used in digital signal processing.

During execution of the filter program, the memory system is utilized as a scratch pad (memory location 402), a source of input data (memory location 406), a source of variable data (memory location 404), and ultimately a storage device (memory location 408) for storing the resultant output data series calculated as part of the filter program. Specifically, the processing element 410 will receive as an input the filter coefficients and input data series from the memory device and output an output data series as part of the filter process. In this particular example, during the execution of the seven tap filter program, the memory area from address location 0x8000 to 0x8006 will be accessed a total of 2048 times in order to implement the filter program. Similarly, address location 0x8200 to 0x8206 will be accessed 1792 times during the execution process. In addition to these high access memory areas, memory location 0x9000 to 0x90ff and 0x9200 to 0x92ff are accessed only 512 times during the execution process.

Those ordinarily skilled in the art will recognize that implementing a memory system as described in the preferred embodiment of the present invention may be advantageously utilized to minimize the power dissipation associated with the frequently used memory areas (for the purposes of this example, address location 0x8000 to 0x8006 and 0x8200 to 0x8206) by providing for a first memory location which is implemented with low threshold and low supply voltage type transistors for minimizing the power dissipation per access of these frequently accessed memory locations. Similarly, by implementing a second memory area which is characterized with high supply voltage and high threshold voltage transistors, power dissipation may be minimized for steady state operations for all lesser frequency accessed memory locations (for the purposes of this example, memory locations 0x9000 to 0x90ff and 0x9200 to 0x92ff).

Considering the operation of the filter shown in FIG. 4 as an example, utilizing the memory architecture of the preferred embodiment of the present invention, would consume only 0.4 microjoules of energy, which results in a 60 milliwatt power dissipation if we assume a 25 nanosecond duty cycle. Alternatively, if a prior art memory system were utilized characterized by only normal memory (high supply voltage and high threshold voltage), the consumed energy would be 1.3 microjoules thereby resulting in a 200 milliwatt power dissipation at a 25 nanosecond duty cycle period. Currently, by implementing a memory system according to the preferred embodiment of the present invention, the memory power consumption has been reduced by a factor of 3.5.

Even more compelling is the case where the memory units are configured for low powered operation. If all of the memory units were implemented as in the prior art with low power memory characterized by low threshold voltage transistors which are powered by low supply voltage sources, then during the dynamic access time, the amount of energy consumed would only be 40 milliwatts. However, during the static standby mode, a memory system configured for low power operation would consume an additional 750 milliwatts of power due to leakage current associated with the low threshold devices. Accordingly, by implementing a memory system according to the preferred embodiment of the present invention, the memory power consumption would be reduced by a factor of 13 as compared to a low power memory implementation.

ALTERNATIVE EMBODIMENTS

The DSP 300 which implements the memory system of the preferred embodiment of the present invention may be further improved to accommodate a minimization of leakage current during the sleep or standby mode of the DSP. Although the leakage current resulting in the DSP 300 is much smaller than the case when the memory system is implemented with low power memory, a small leakage current arises in the preferred embodiment of the present invention associated with the small number of low power and low threshold memory units utilized for local memory. This small leakage current may still cause problems for applications of the DSP. Accordingly, the leakage current may be minimized even more by implementing an alternative memory architecture which allows for the repositioning of variables from local memory to normal memory prior to sleep or standby mode. By repositioning the data, local memory power may be shutdown completely thereby cutting off any stand-by current flow due to the local memory.

Figure 5A:
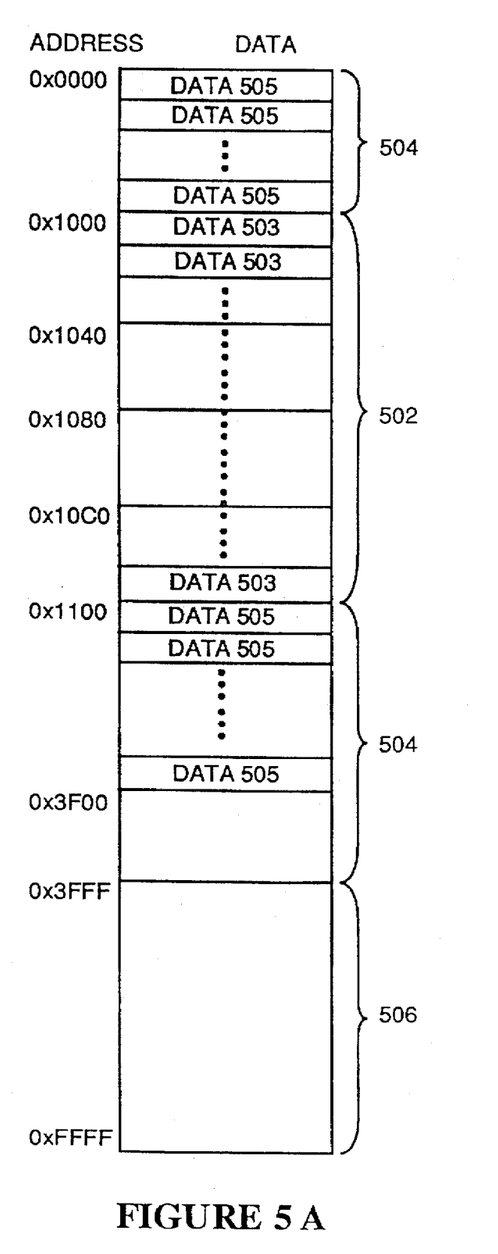
FIG. 5a shows a memory map of a reduced power memory system for use in a digital signal processor prior to entering sleep mode.
Figure 5B:
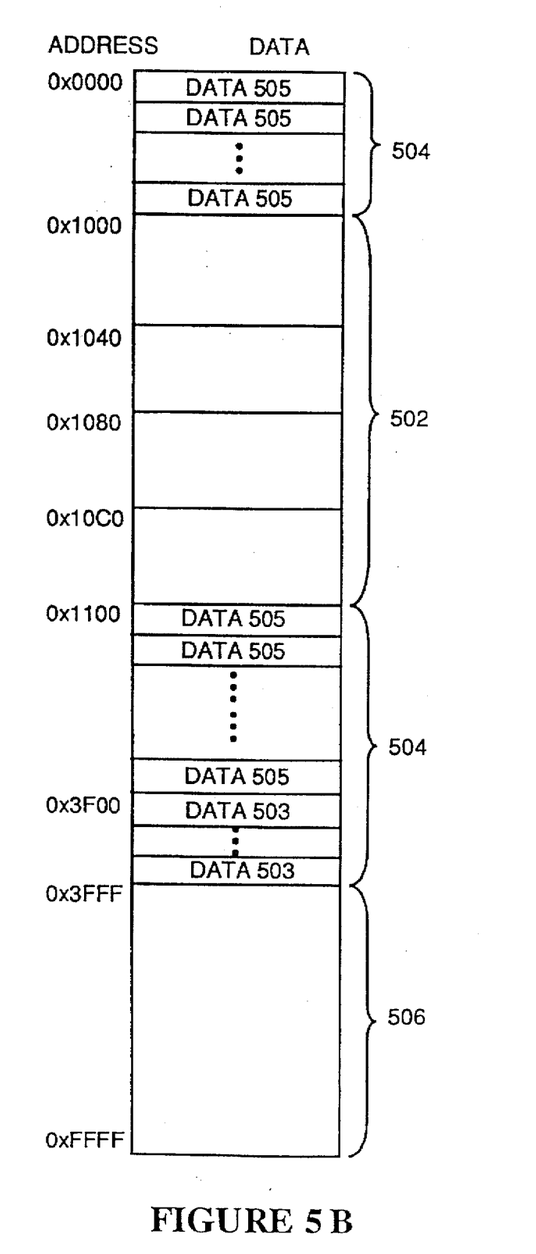
FIG. 5b shows a memory map of a reduced power memory system for use in a digital signal processor after entering a sleep mode when incorporating a power saving sleep mode process.

Referring now to FIG. 5a, a memory map 500 associated with an alternative embodiment of the present invention is shown. The memory map 500 reflects the condition of the memory system prior to the DSP entering a sleep mode. Local memory storage area 502 is configured as a low power memory area containing data bytes 503 associated with the most frequently accessed memory locations. Normal memory storage area 504 is configured as a high power memory area for storing the remaining lesser accessed program data bytes 505. Referring now to FIG. 5b, a memory map of the alternative memory architecture after the host DSP has entered sleep mode is shown. In this alternative embodiment, the DSP transfers the variable information (data bytes 503) stored in the local low power, low threshold voltage transistor memory (local memory 502) just prior to entering a sleep or standby mode of the DSP to the normal memory (504). There afterwards, the power to the local memory may be shut down and leakage current from the memory system is virtually eliminated. This is of course due to the high threshold and high supply voltage transistors utilized in normal memory which result in zero leakage current during smile non-access conditions. When the DSP transitions out of the sleep or standby mode back to normal operation, all of the necessary data (data bytes 503) from the normal memory 504 can be transferred back into local memory 502 and power to local memory can be restored. Those ordinarily skilled in the art will recognize that this is an overhead function controlled by the processing in the DSP architecture. By implementing such an architecture, zero leakage current will result during the static or sleep standby mode of the DSP.

In another alternative embodiment, the reduced power memory system of the preferred embodiment of the present invention may be utilized in a cache memory scheme. Typically a cache memory scheme utilizes a small memory element (the cache) in conjunction with a larger memory storage device (main memory), for optimizing speed and power considerations as described above. In a cache architecture, the cache is utilized to store the most recently accessed data (and associated address) in a location which is "conveniently" able to be accessed. Optimization arises as "hits" (memory requests of memory location stored in the cache) occur in the cache, thereby resulting in faster memory response to processor requests as well as improved power dissipation performance because of the shorter bus lengths.

Figure 6:
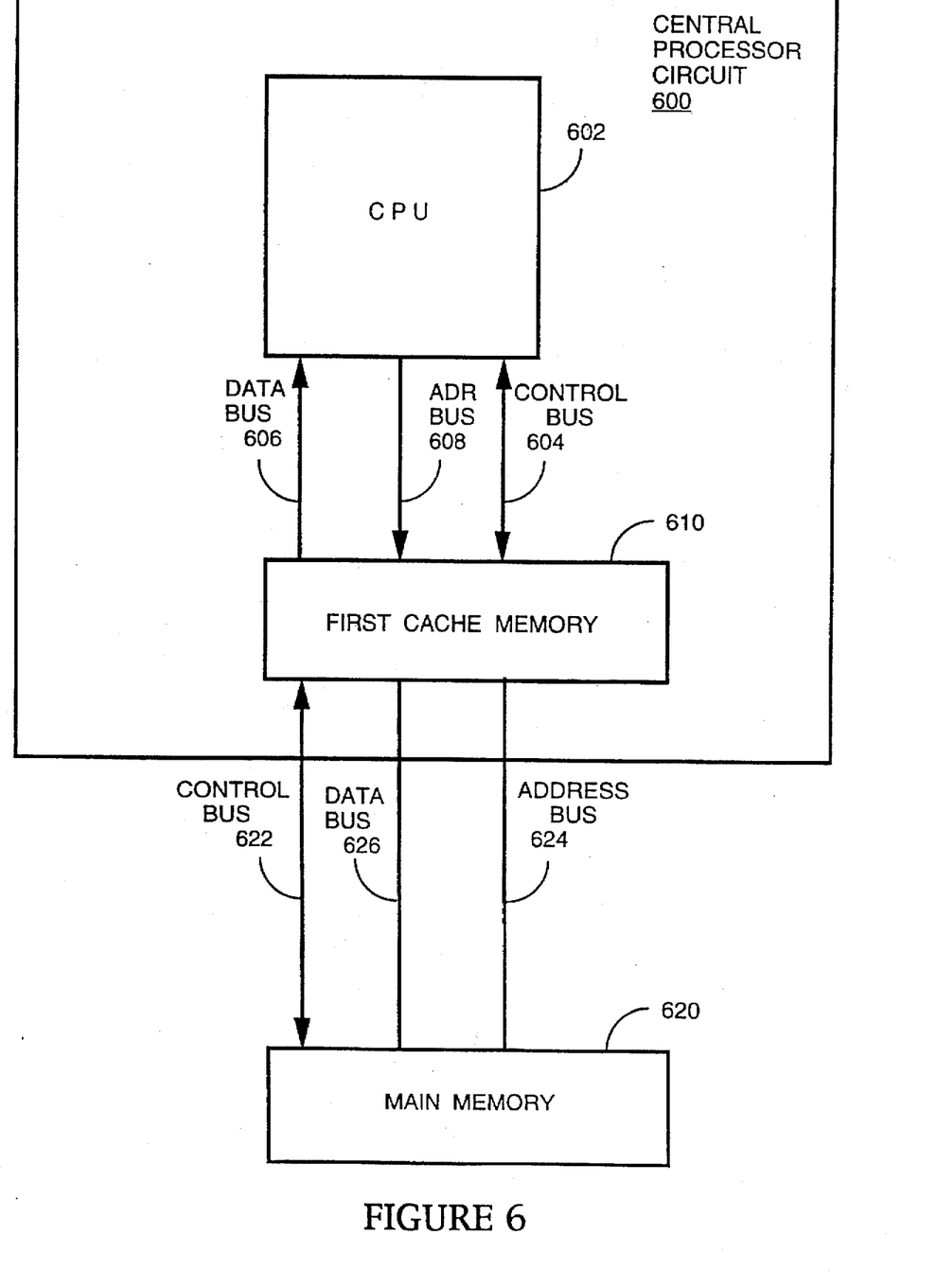
FIG. 6 shows a cache memory architecture incorporating a reduced power memory system according to an alternative embodiment of the present invention.

Referring now to FIG. 6, a cache memory architecture implementing the teachings of the present invention is shown. A central processor circuit 600 includes a central processing unit 602, a control bus 604, a data bus 606, an address bus 608 and a first cache memory 610. An external memory element 620 is coupled to the first cache memory via control line 622, address line 624 and data line 626. The cache memory 610 is implemented with memory units having low threshold voltage transistors which are powered by a low voltage power source ($V_{th}$=0.2V and $V_{DD}$=1.5V). Accordingly, the cache memory is configured much as the local memory of the preferred embodiment of the present invention. Alternatively, the main memory 620 is implemented with memory units having higher threshold voltage transistors which are powered by a high voltage power source ($V_{th}$=0.5V and $V_{DD}$=3.0V).

In a typical read operation, the central processing unit 602 issues a read request on the control bus 604 designating an associated address on the address bus 608 to be read. Upon receiving the read request, the cache memory 610 attempts to fill the request, determining if the requested data is stored at one of its addresses. The cache memory may utilize direct mapping, associative mapping or any other mapping scheme to map the real addresses to its own internal addresses. If the requested block of data is found in the first cache memory 610, it is outputted onto the data bus 606 for transfer back to the requesting processor. Alternatively, if the data block is not found, the read request signal and address are passed onto the main memory via the control 622 and address bus 624 for retrieval of the data block from main memory. Upon receipt of the request from the first cache, the main memory will write the data to the first cache 610 via the data line 626, which will in turn "victimize" a current data entry in the cache (writeback to main memory if required), and output the data to the processor on the data bus 606.

The cache memory maintenance, address manipulation, search routines and victimization routines may be implemented as is known in the art. Those ordinarily skilled in the art will recognize that any single or multi-level cache scheme may be optimized for dynamic and static performance by providing the combination of low power and high power memory units as is disclosed in the present invention. In this embodiment, the cache memory is constructed from low power memory (low supply voltage and low threshold voltage), while the main memory is implemented with normal memory units (high threshold voltage and high supply voltage transistors). By implementing the combination of low power memory and high power memory, the overall power dissipation of the memory system can be optimized. Accordingly, the dynamic power consumption of the cache memory is small during the frequent accesses associated with the cache memory device due to the low threshold transistors implemented in the low power memory. The main memory consumes no static power thereby minimizing the power dissipation associated with that portion of memory which has not been accesses recently. In summary, the overall power consumption may be lowered because both the frequently accessed memory locations and the less frequently accessed memory locations have been optimized to minimize power dissipation in their normal mode of operation.

While the preferred embodiment of the present invention has described a static RAM embodiment, those ordinarily skilled in the art will recognize that the inventive concept of the present invention may be applied to other types of memories including DRAM, flash memory, mask ROM, and EPROM memories. Additionally, on chip memories as well as multi-chip memory modules or off-chip memory architectures may be utilized in implementing the memory systems of the present invention.

While the present invention has been described with reference to a few specific embodiments, the description is illustrative of the invention and is not to be construed as limiting the invention. Various other modifications may occur to those skilled in the art without departing from the true spirit and scope of the invention as defined by the appended claims.

What is claimed:

1. A reduced power combinational memory system for storing data and instructions for use by a host processor comprising:

a first memory element, said first memory element including a first plurality of memory units for storing frequently accessed ones of said data and instructions, each one of said first plurality of memory units including low power transistors having a first threshold voltage for designating a first and second state of a respective one of said first memory units, said low power transistors powered by a first power supply voltage, said low power transistors providing reduced power consumption during dynamic state but consuming power during steady state due to leakage current at the first threshold; and a second memory element located separate from said first memory element, said second memory element including a second plurality of memory units for storing less frequently accessed ones of said data and instructions, each one of said second plurality of memory units including high power transistors having a second threshold voltage which is higher than said first threshold voltage for designating between said first and said second state, said high powered transistors power by a second power supply voltage which is greater than said first supply voltage, said high power transistors providing high speed dynamic performance;

said low power transistors maintaining high memory speed while reducing dynamic power consumption during access to said first memory element by said host processor, said high power transistors maintaining high memory speed while reducing static power consumption during non-access periods with said second memory unit by said host processor;

said first plurality of memory units sized to store the most frequently accessed data and instructions in an executable program;

said second plurality of memory units sized to store all lesser frequently accessed data and instructions in said executable program;

means responsive to memory control signals for selectably loading a particular data or instruction into one of said first or said second memory element of said memory system according to predicted frequency of access of each data and instruction;

said combinational memory system maintaining speed while providing optimized power consumption at both static and dynamic memory states.

2. The memory system of claim 1, wherein said first threshold voltage is approximately 0.2V and said second threshold voltage is approximately 0.5V.

3. The memory system of claim 1, wherein said first supply voltage is approximately 1.5V and said second supply voltage is approximately 3.0V.

4. The memory system of claim 1, wherein said first memory element is mounted on-chip with said host processor.

5. The memory system of claim 4, wherein said second memory element is mounted on-chip with said host processor.

6. A method for minimizing static and dynamic power dissipation in a memory system during the execution by a host processor of a program having instructions and data stored in said memory system, the method comprising the steps of:

providing a first memory area connected to said host processor, said first memory area comprising a first plurality of low power memory units including first threshold voltage level transistors powered by a first voltage source, said first threshold voltage level transistors maintaining high memory speed while reducing dynamic power consumption during access to said first memory area by said host processor, said first plurality of memory units sized to store the most frequently accessed data and instructions in an executable program;

providing a second memory area, separate from said first memory element, connected to said host processor, said second memory area comprising a second plurality of high power memory units including second threshold voltage level transistors powered by a second voltage source, said second threshold voltage being higher than said first threshold voltage and said second voltage source being a higher voltage source than said first voltage source, said second threshold voltage level transistors maintaining high memory speed while reducing static power consumption during non-access periods to said second memory area by said host processor, said second plurality of memory units sized to store all lesser frequently accessed data and instructions in said executable program;

identifying more frequently accessed ones of said instructions and data which are to be accessed frequently during the execution of said program by said host processor;

storing said frequently accessed ones of said instructions and data in said first memory area;

identifying less frequently accessed ones of said instructions and data which are to be accessed less frequently during the execution of said program by said host processor than said more frequently accessed ones; and storing said less frequently accessed ones of said instructions and data in said second memory area;

power dissipation during combined static and dynamic operation of said memory system being reduced without affecting effective memory speed by storing frequently accessed data and instructions to said first memory area and performed at high speed, and by storing less frequently accessed data and instructions to said second memory area with low power dissipation.

7. The method of claim 6, further including the steps of:

initiating a data transfer from said first memory area to said second memory area of all of said frequently accessed ones of said instructions and data if said host processor enters a sleep mode;

turning off said first voltage source to said first memory area; and turning on said first voltage source and re-transferring back from said second memory area to said first memory area all of said frequently accessed ones of said instructions and data when said host processor exits from said sleep mode.

8. A reduced power digital signal processor comprising:

a central processing unit for executing program instructions;

a storage element for storing data and said program instructions, said storage element including:

a first memory area having a first plurality of memory units for storing frequently accessed ones of said data and program instructions, each of said first memory units including low power transistors having a first threshold voltage for designating a first and second state of a respective first memory unit, said low power transistors powered by a first power supply voltage, and a second memory area having a second plurality of memory units for storing less frequently accessed ones of said data and instructions, each of said second memory units including high power transistors having a second threshold voltage which is higher than said first threshold voltage for designating between said first and said second state, said high powered transistors powered by a second power supply voltage which is greater than said first supply voltage, said first memory area dissipating less power during accesses by said digital signal processor than said second memory area, and said second memory area dissipating less power during static operations than said first memory area;

said second plurality of memory units being physically separate from and a greater number than said first plurality of memory units;

first address, data, and control busses coupled between said first memory area and said central processor unit for transferring data between said first memory area and said central processor unit; and second longer address, data, and control busses coupled between said second memory area and said central processor unit for transferring data between said second memory area and said central processor unit.

9. The reduced power digital signal processor of claim 8 further comprising:

sleep mode circuitry, said sleep mode circuitry including memory content transfer circuitry for transferring said frequently accessed ones of said instructions and data from said first memory area to said second memory area upon said digital signal processor entering a sleep mode, shut-down circuitry for turning off said first voltage source after said transfer, and re-initiation circuitry for mining on said first voltage source and re-transferring said frequently accessed ones of said instructions and said data back to said first memory area upon said digital signal processor's exit from said sleep mode.

* * * * *

UNITED STATES PATENT AND TRADEMARK OFFICE
CERTIFICATE OF CORRECTION

PATENT NO. : 5,687,382
DATED : November 11, 1997
INVENTOR(S) : Kojima, et al.

It is certified that error appears in the above-indentified patent and that said Letters Patent is hereby corrected as shown below:

Col. 12, line 29: delete "mining" and insert --turning--

Signed and Sealed this

Seventh Day of March, 2000

Attest:

Q. TODD DICKINSON

*Attesting Officer*   *Commissioner of Patents and Trademarks*